United States Patent [19]

O'Sullivan et al.

[11] 4,392,103

[45] Jul. 5, 1983

[54] CURRENT SENSING REGULATOR

[75] Inventors: Dermot O'Sullivan, Leiderdorp; Alan Weinberg, Sassenheim, both of Netherlands

[73] Assignee: Organisation Europeenne de Recherches Spatiales, Paris, France

[21] Appl. No.: 271,217

[22] Filed: Jun. 8, 1981

[30] Foreign Application Priority Data

Jun. 10, 1980 [BE] Belgium .............................. 200973

[51] Int. Cl.³ .......................................... H02P 13/32
[52] U.S. Cl. .................................... 323/222; 323/267; 323/284; 323/285
[58] Field of Search ............... 323/222, 267, 272, 284, 323/285

[56] References Cited

U.S. PATENT DOCUMENTS

| | | | |
|---|---|---|---|
| 3,531,712 | 9/1970 | Cecchini | 323/285 |
| 4,257,090 | 3/1981 | Kröger et al. | 323/222 |
| 4,311,954 | 1/1982 | Capel | 323/222 |

OTHER PUBLICATIONS

Electron, (GB), No. 172, p. 14, Apr. 10, 1979, S 91830029.

Paper Presented at 'Powercon 7' Seventh National Solid-State Power Conversion Conference & Exhibit, Mar. 25-27, 1980, by Redl et al. Entitled: Switching-Mode Power Converters: Optimizing Dynamic Behavior with Input and Output Feed-Forward and Current-Mode Control.

*Primary Examiner*—William H. Beha, Jr.
*Attorney, Agent, or Firm*—McCormick, Paulding & Huber

[57] ABSTRACT

A current sensing regulator operates in a switching mode of regulation between two sensed current levels in a free-running operation, or between one of the current levels and an intermediate level in a fixed-frequency synchronization operation. The sensed current levels at which switching occurs are set through a command signal, and a comparator controls switching at the set current levels or at the occurrence of synchronization pulses.

6 Claims, 3 Drawing Figures

CURRENT SENSING REGULATOR

BACKGROUND OF THE INVENTION

The present invention relates to an apparatus for controlling an operating parameter of an installation, which parameter is related to an electric current feeding a regulation unit operating in switching mode.

A regulation apparatus is known which incorporates an electric modulator designed to operate in conductance control mode. In this type of regulation apparatus the minimum and maximum limits of the current are monitored by a command voltage with a free-running frequency. Such an apparatus conciliates the advantage of a direct limitation of the power module current to the advantage of having a first order transfer function as against a second order transfer function for the conventional regulators. In the conductance control mode regulation apparatus the operation results in a 90° maximum phase shift which compares favorably to the 180° inherent maximum phase shift in the conventional regulators. The conductance control mode regulation apparatus thereby exhibits a substantial progress in the switching regulation art. However this known apparatus is difficult to synchronize. Now the synchronization problem can be of importance in a number of applications. An improvement in the art has already been designed to synchronize a conductance control mode regulation apparatus. This improvement comprises an electric modulator operating with a sole threshold for the current switching, said threshold varying in relation with the sensed current. The modulator uses a synchronization signal for starting the regulation mechanism and the latter ends when the sensed current reaches the switching threshold. This results in a fixed-frequency operation and in the current being controlled to a value which depends on the command signal and the synchronization frequency. Though a fixed-frequency operation is advantageous in that it allows paralleling of several de-phased regulation modules, thereby reducing the filtering mass, this improved apparatus has tendency of instability at certain duty cycles of operation but perhaps the most significant is that the synchronization signal is essential for all paralleled modules to operate, thus requiring a high redundant and complex multiphase synchronization signal generator where reliable and single point failure-free operation is required, e.g. in satellite power regulator applications.

The problem which the invention aims to solve is to provide a regulation apparatus capable of free running operation with current switching mode between two controllable limits as well as fixed-frequency synchronization operation.

SUMMARY OF THE INVENTION

In accordance with this invention there is provided a regulation apparatus which includes a controller comprising switch means connected for switching the regulating switch in response to synchronization pulses and each time the sensed current reaches a predetermined control level depending on a command signal. Means are further provided to switch said regulating switch each time the sensed current reaches one of two control levels which depend on the command signal.

DESCRIPTION OF AN EXEMPLARY EMBODIMENT

The principle and the regulation mechanism of the apparatus according to the invention are described in their application to the regulation of an electric voltage. The parameter to be regulated here is the voltage Vo applied across a load represented by a resistor R and a capacitor C. The regulation is preformed through a conventional regulation unit, known per se, connected across the load and including a controlled regulating switch Qo, an induction coil L for energy storage and a diode D (cf. FIG. 1.). These elements are conventional elements currently used in a switching voltage regulator. The basic circuity further includes an error amplifier (labeled $A_E$ in FIG. 3) which is connected to produce a command signal Vc representing the deviation of the output voltage Vo from a predeterminal reference voltage.

Figure 1:
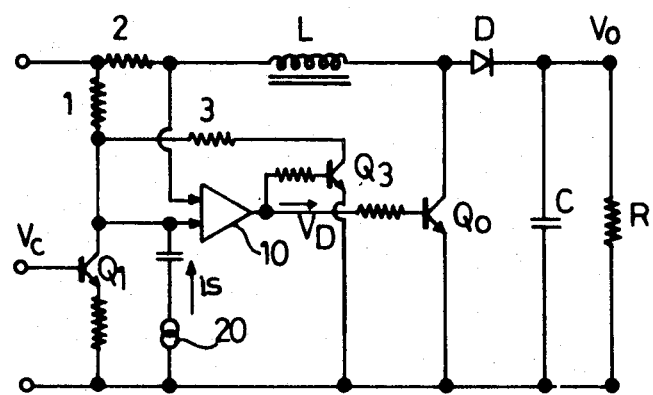
FIG. 1 is a simplified schematic drawing of the regulation apparatus according to the invention.

FIG. 1 illustrates a basic circuit diagram of the apparatus of this invention. The transistor $Q_1$ constitutes a reference current generator controlled by the command signal Vc. The reference current drawn from transistor $Q_1$ produces across resistor 1 a reference voltage drop $V_1$ which is applied as a first input to a comparator device 10. The resistor 2 forms a sensing device for the current I through the induction coil L. The voltage drop $V_2$ produced across resistor 2 is applied as a second input to comparator 10. The output signal from said comparator is the drive voltage $V_D$ for the regulating switch Qo.

The circuitry is arranged to produce a current reference signal having two predetermined control levels $I_H$ and $I_L$ which are related to the value of the command signal $V_C$. The drive signal $V_D$ has tow logic states: a first logic state $V_{D1}$ occurs when the current sensing signal is increasing and remains lower than the control level $I_H$, and a second logic state $V_{D2}$ occurs when the current sensing signal is equal to or greater than the control level $I_H$ and this state $V_{D2}$ lasts until the current sensing signal is equal to or lower than the control level $I_L$. The transistor $Q_3$ and the resistor 3 form a circuit serving to switch the current reference signal from its first control level $I_H$ to its second control level $I_L$ in response to the drive signal $V_D$ having its first logic state $VD_1$ and to switch the current reference signal from its control level $I_L$ to its control level $I_H$ in response to the drive signal $V_D$ having its second logic state $V_{D2}$.

To the comparator device 10 is capacitively connected a synchronization source 20 for delivering synchronization pulses $i_S$, the function of which will be described later herein. In FIG. 1 the synchronization source 20 is directly connected to the input of comparator 10 by way of example.

In absence of any synchronization pulse, the control apparatus described above operates in the following manner in the regulation process. The switch Qo being assumed to be OFF, that is the transistor Qo being non-conducting, the current I through the induction coil L is increasing. When the instantaneous value of this current reaches the level $I_H$, the control signal $V_D$ in its first logic state $VD_1$ causes the transistor $Q_0$ to switch ON (that is in conducting state). Thereby the current I through the induction coil L keeps flowing through diode D and the current I is caused to decrease. Concurrently, the current reference signal switches from the upper control level $I_H$ to the lower control level $I_L$.

As soon as the decreasing current I reaches the lower control level $I_L$, the drive signal $V_D$ switches to its logic state $V_{D2}$, whereby the transistor $Q_0$ is again switched to OFF and consequently the current I is caused to increase again. Simultaneously, the current reference signal switches to the upper control level $I_H$. As soon as the increasing current I reaches said upper control level $I_H$, the switching process described above is repeated. Thus the current switches between two control levels $I_L$ and $I_H$ as shown in FIG. 2, section A.

Figure 2:
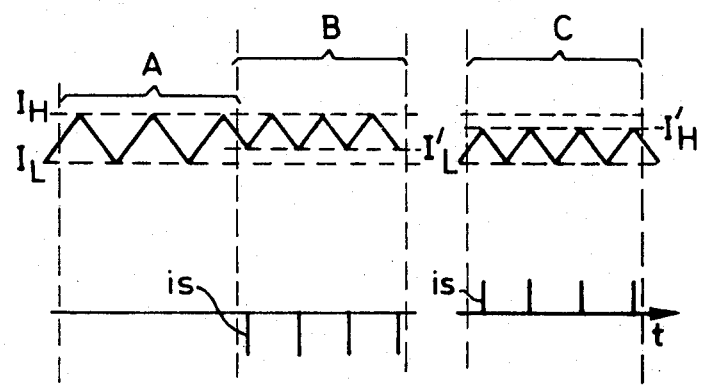
FIG. 2 is a diagram illustrating the operation of the apparatus according to the invention.

When the synchronization source 20 provides negative pulses $i_S$, the drive signal $V_D$ is caused to switch to its first logic state $V_{D1}$ in response to the occurrence of each pulse $i_S$, which occurs prior to the sensed current reaching the lower control level $I_L$ (see FIG. 2, section B). The drive signal $V_D$ then keeps its first logic state $V_{D1}$ until the increasing sensed current reaches the upper control level $I_H$. The current thus switches continuously between control levels $I_H$ and $I'_L$.

When the synchronization source 20 provides positive pulses $i_S$, the drive signal $V_D$ is caused to switch to its second logic state $V_{D2}$ in response to the occurrence of each pulse $i_S$, which occurs prior to the current sensing signal reaching the upper control level $I_H$ (see FIG. 2, section C). The drive signal $V_D$ then keeps its second logic state until the decreasing sensed current reaches said lower control level $I_L$. The current thus switches continuously between control levels $I_L$ and $I'_H$. Upon the synchronization signal being removed, the drive signal $V_D$ is automatically held in its present logic state until the sensed current reaches one of said control levels ($I_H$ or $I_L$), the current reference signal being caused to switch from that one control level to the other each time the control signal $V_D$ is caused to switch (FIG. 2, section A).

Figure 3:
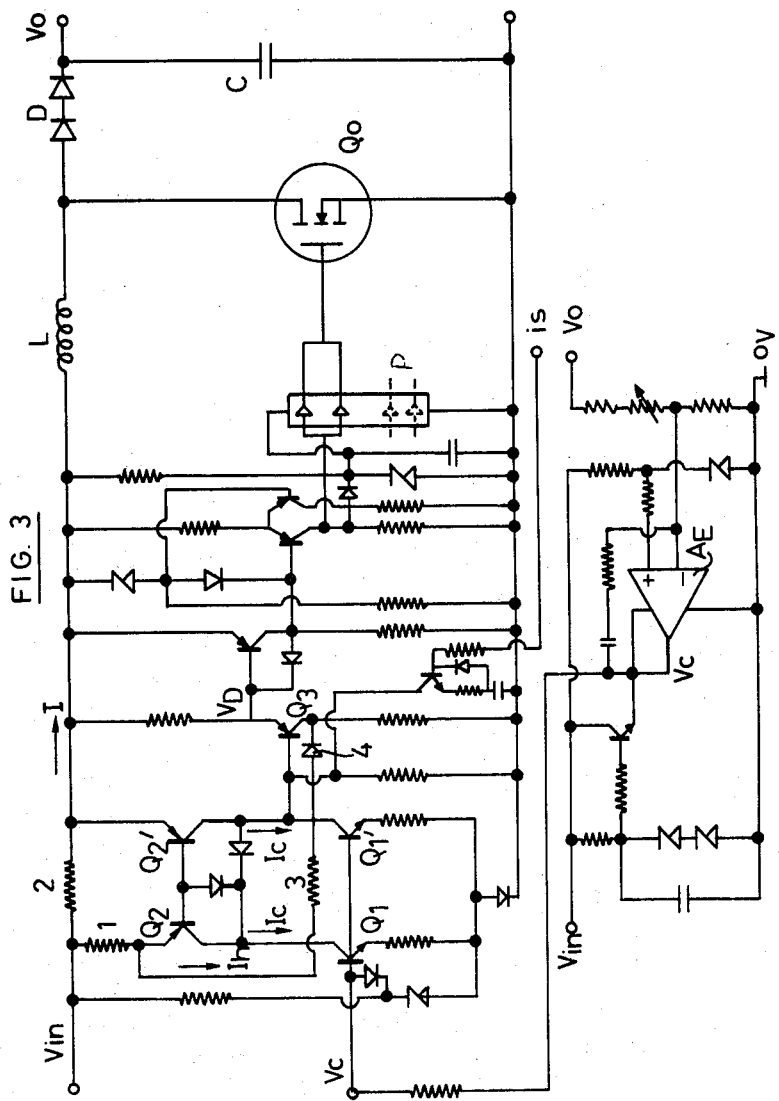
FIG. 3 is a schematic diagram of an exemplary embodiment.

Referring now to FIG. 3 there is shown an exemplary embodiment of the apparatus in accordance with this invention. The command signal $V_C$ is applied to the two transistors $Q_1$ and $Q_1'$ whereby equal collector currents $I_C$ are drawn from transistors $Q_2$ and $Q_2'$ which form the comparator device. The offset voltage between the functions of these two transistors is consequently low (in the order of 1 to 2 mV), which enables a very precise amplification of the voltage offset between the reference voltage $V_1$ and the sensing voltage $V_2$ across resistor 2. In this embodiment, the synchronization signal $i_S$ is applied to the base of transistor $Q_3$ (FIG. 2, section C). The occurrence of a synchronization pulse $i_S$ momentarily forces transistor $Q_3$ to ON, which forces the drive signal $V_D$ to switch to its second logic state $V_{D2}$, and the transistor switch $Q_0$ is maintained ON until the current I reaches the lower control level $I_L$: the regulating switch $Q_0$ is then forced to OFF until the occurrence of the next synchronization pulse $i_S$. It is seen that the current thus switches between the control levels $I'_H$ and $I_L$.

As soon as the synchronization signal $i_S$ is removed, or maintained on a DC value, the switching of transistor $Q_0$ reverts to the nominal switching mode according to which the current is switching between values corresponding to the control levels $I_L$ and $I_H$ of the current reference signal.

Among the advantages of the regulation apparatus according to the invention, emphasis will be laid on the easy paralleling of a plurality of apparatus modules feeding the same load: these modules would then be controlled by the same command signal $V_C$, which allows the direct control of power sharing between modules. The paralleling connection of a second regulation module is schematically illustrated in dotted lines labelled P in FIG. 3. Besides the advantages of the prior current switching regulation apparatus (inherent current limitation, dynamic stability as a function of the input voltage and load variations, easy paralleling), the apparatus of the invention has the advantage of being capable of operating at a fixed frequency without complex additional circuitry. When multiphase synchronization is used, the apparatus of the invention ensures a continuous free-running operation in case of a possible failure of the synchronization source, which allows a highly reliable autonomous operation with a relatively inexpensive equipment. It will be apparent to one skilled in the art that the regulation apparatus according to the invention can be realized in various embodiments departing by several details from the exemplary embodiment described above and that the apparatus applies to other regulator types.

What is claimed is:

1. In an apparatus for the control of an operating parameter of an installation, said parameter being related to an electric current feeding a regulation unit including a regulating switch arranged for being switched between a first non-conducting logic state and a second conducting logic state in response to a drive signal, an electric controller operating in conductance control mode, comprising:

current reference signal generator means connected to be responsive to a command signal for generating a current reference signal the amplitude of which is a function of said command signal, said current reference signal having a upper control lever and a lower control level;

current sensor means connected to sense said electric current and to generate a sensing signal representing said current;

comparator means connected to compare said current sensing signal to said current reference signal for producing said drive signal for the regulating switch, said comparator means being further connected to a synchronization source for accepting synchronization pulses to switch said drive signal having a first state when the increasing sensing signal is equal to or greater than the lower control level of the current reference signal and having a second state when the decreasing current sensing signal is equal to or lower than the upper control level of the current reference signal.

2. An apparatus according to claim 1, wherein the comparator means is connected to a synchronization source for accepting synchronization pulses to switch said drive signal to its first state in response to each synchronization pulse and to maintain the drive signal in its first state until the increasing current sensing signal is equal to or greater than the upper control level of the current reference signal.

3. An apparatus according to claim 2, wherein the comparator means comprises means to maintain said drive signal in its second state until the decreasing current sensing signal is equal to or lower than the lower control level of the current reference signal in absence of synchronization pulse.

4. An apparatus according to claim 1, wherein the comparator means is connected to a synchronization source for accepting synchronization pulses to switch said drive signal to its second state in response to each synchronization pulse and to maintain the drive signal in its second state until the decreasing current sensing signal is equal to or lower than the lower control level of the current reference signal.

5. An apparatus according to claim 4, wherein the comparator means comprises means to maintain said drive signal in its first state until the increasing current sensing signal is equal to or greater than the upper control level of the current reference signal in absence of synchronization pulse.

6. An apparatus according to claim 4, wherein the current reference signal generator comprises first and second transistors connected to accept the command signal on their bases, and wherein the comparator means comprises third, fourth and fifth transistors having their bases connected therebetween, said third transistor having its emitter electrode connected to one end of a current sensing resistor through a reference element resistor and having its collector electrode connected to the collector electrode of said first transistor, said fourth transistor having its emitter electrode connected to the other end of said current sensing resistor and having its collector electrode connected to the collector electrode of said second transistor, and said fifth transistor having its base connected to the collector electrode of said second transistor with its emitter electrode connected to the emitter electrode of said fourth transistor and its collector electrode connected through a resistive circuity to the emitter electrode of said third transistor, said fifth transistor further having its base connected to accept synchronization pulses and having its emitter electrode further connected to accept said command signal.

* * * * *